United States Patent [19]

Morgan, Jr.

[11] Patent Number: 4,870,455

[45] Date of Patent: Sep. 26, 1989

[54] PRE-PRESS COLOR PROOF SYSTEM HAVING IMPROVED TONAL RANGE IN HIGHLIGHT AREAS (PIN DOT DETAIL)

[75] Inventor: James T. Morgan, Jr., Columbus, Ga.

[73] Assignee: J. Tom Morgan Enterprises, Inc., Columbus, Ga.

[21] Appl. No.: 203,497

[22] Filed: Jun. 7, 1988

[51] Int. Cl.[4] .......................... G03B 27/32; G03B 27/52
[52] U.S. Cl. ............................................ 355/77; 355/32
[58] Field of Search ................................ 355/32, 35, 77

[56] References Cited

U.S. PATENT DOCUMENTS

| | | | |
|---|---|---|---|
| 4,553,835 | 11/1985 | Morgan | 355/77 |
| 4,806,984 | 2/1989 | Asano | 355/32 |

Primary Examiner—Donald A. Griffin
Attorney, Agent, or Firm—Hovey, Williams, Timmons & Collins

[57] ABSTRACT

A method is disclosed of preparing an extended tonal range pre-press proof of an original subject in color using photographic color print paper. Yellow, magenta and cyan color halftone separation negatives and positives of the original subject are prepared along with a pin dot maker film positive (PDM) which is clear only in the extremely fine highlight detail areas of the color original. After exposure of photographic color print paper to combinations of the yellow, magenta and cyan halftone separation negatives and positives through respective blue, green and red filters, in each instance the yellow, magenta and cyan halftone negatives are used to again expose the undeveloped print paper to blue, green and red filtered light respectively in association with the PDM. A black separation halftone negative may also be used in the process to improve the final appearance of the product. The resulting pre-press color proof has enhanced fine highlight color detail. Pin dots and vignettes match detail which is to be lithographically reproduced or reproduced by a variety of printing procedures such as lithographically or with a gravure press or the like.

10 Claims, No Drawings

PRE-PRESS COLOR PROOF SYSTEM HAVING IMPROVED TONAL RANGE IN HIGHLIGHT AREAS (PIN DOT DETAIL)

BACKGROUND OF THE INVENTION

1. Field of the Invention

This invention relates to a process for preparing an extended tonal range pre-press proof of an original color subject using photographic color print paper.

Specifically, the method is an improvement over the procedures illustrated and described in my prior U.S. Pat. No. 4,553,835, issued Nov. 19, 1985 and entitled "Process for Producing Pre-Press Color Proofs".

In particular, this invention further extends the tonal range of the process illustrated and described in the '835 patent in that it provides a relatively close match to the tonal values of the original including those which must be produced by pin dots in a lithography reproduction.

2. Description of the Prior Art

In the '835 patent, a process is described for preparing a pre-press color proof using color print paper which provides a tonal range that substantially matches the solid colors, the three-quarter tone (approximately 75%), the mid-tone (approximately 50%), and the quarter-tone or highlight detail (about 25%) values of the original artwork. The shadow areas (100%-75%) and tones of the original artwork were reproduced in the pre-press proof process of the '835 patent by separately placing the yellow, magenta and cyan negatives on the undeveloped color print papers and sequentially exposing each through blue, green and red filters respectively.

Further, in the '835 patent, mid-tone and highlight quarter-tone areas of the original artwork were reproduced in the pre-press proof process by placing on the undeveloped color print paper when the magenta separation negative is associated therewith, the magenta separation positive; the yellow separation positive on the print paper when the yellow separation negative is associated therewith; the cyan separation positive on the print paper with the cyan separation negative; and in each instance passing light through green, blue and red filters respectively for time periods sufficient to cause the mid-tones and quarter-tones to be duplicated in the final pre-press proof.

However, it was found that the procedure of the '835 patent did not always reliably reproduce the extreme highlight areas which must be printed lithographically with pin dots of varying diameter and spacing. This was especially true as to areas which vignetted from slight detail to none which can be lithographically reproduced only by very fine dots which fade into no dot at all. Specular reflections, sharp drop-outs and images which require dot vignettes for matching of original artwork are very difficult to accurately reproduce in a prepress proof. To solve the difficulty, a procedure has now been developed as described herein to obtain that important detail of tone values in the proof.

SUMMARY OF THE INVENTION

After preparation of yellow, magenta and cyan color halftone separation negatives and positives utilizing the halftone separation yellow and magenta negatives, of the original color subject, as described in U.S. Pat. No. 4,553,835, a pin dot maker film positive (PDM) is prepared. Lithographic contact film is successively exposed to light through the yellow halftone color separation negative and the magenta halftone separation negative. (When light blue predominates the highlight areas of the art, the yellow and cyan separation negatives are used to prepare the PDM.) Exposure of the contact film to the white light of a normal halftone contact source is for a time period to cause the PDM prepared therefrom to be clear only in the extreme highlight or fine detail areas of the image to be reproduced.

The PDM is used in conjunction with the procedures of the '835 patent. The color print paper which ultimately becomes the pre-press color proof is exposed to light through appropriate yellow, magenta and cyan negatives with blue, green and red filters respectively. A second exposure is made with the combination of the yellow negative and yellow positive, the combination of the magenta negative and magenta positive, and the combination of the cyan negative and cyan positive. After each exposure of the undeveloped color print paper to light through a filter and its corresponding halftone separation negatives and positives, in each instance the positive is removed from the support, the PDM is placed over the remaining color halftone negative and the print paper again exposed to light through a respective filter. The time of this third exposure through each halftone negative is several times that of the initial exposure through a corresponding negative and positive, so that the final pre-press proof will not only closely match the original artwork throughout its tone range value including shadows, three-quarter tones, mid-tones, and quarter-tones, but also extreme highlight tone detail.

As in the '835 patent, it is desirable that the undeveloped print paper also be exposed to light through each of the filters while a halftone black negative which usually is in a skeleton range, overlies the print paper. (The PDM is used only if full range black halftone is utilized.)

The exposed print paper may then be developed in an automatic film processor in a conventional manner to produce a pre-press proof that very closely matches the original artwork and is accurate for customer approval for press run.

DETAILED DESCRIPTION OF THE INVENTION

The pre-press color proof preparation process of this invention does not replace the procedures described and illustrated in U.S. Pat. No. 4,553,835, but is an adjunct thereto for extending the tonal range of color paper. By addition of this procedure to that of the '835 patent, there is significant enhancement of the extremely fine highlight detail. A photographic color print proof is thereby prepared which closely matches the color and tonal range values of original artwork not only in the areas of shadow, three-quarter tone, midtone and quarter-tone but also provides a reproduction of fine highlight detail which is lithographically reproduced by pin dots and vignetted areas.

1. Preparing the PDM Film

In order to prepare the required pin dot detail, one film positive is necessary in addition to the yellow, magenta and cyan color halftone separation negatives and positives of the original artwork, and the halftone black separation negative produced in accordance with the procedures of the '835 patent. This additional film positive is designated as a pin dot maker (PDM). The PDM film positive is prepared using conventional lith type contact film (e.g., Ultratec UCF film). Development of this type of contact film may be accomplished with a conventional developer such as Ultratec Kodalith Developer in an automatic processor.

The procedures described hereinafter for making the PDM is carried out in a conventional photographic darkroom and exposure is made under a red safelite with white light on the ortho contact film.

The unexposed lith type contact film is laid over a conventional contact vacuum frame with pin registration. The film has previously been punched to form openings therein which receive respective registration pins in a manner such that the film is held in a predetermined fixed position with respect to the pins without movement therebetween.

Preparation of the PDM is accomplished as follows: First, the yellow halftone separation negative prepared as described in the '835 patent and which has holes punched therein for receipt of the vacuum frame registration pins is placed over the ortho contact film with the emulsion side of the negative facing downwardly. The contact film is exposed to white light for a time period that is conventional for contact film exposure, e.g., about 10 seconds. The yellow negative is removed and replaced with the magenta halftone separation negative which has been punched so that the images thereon register with the images on the yellow separation negative previously. The magenta halftone negative is also placed over the contact film with the emulsion side down. Another exposure of the contact film to white light is carried out through the magenta negative for the usual contact film exposure period of 10 seconds or the like.

The magenta negative overlying the exposed contact undeveloped film is removed from the vacuum table and subjected to conventional contact development procedures through a lith type processor. The result is an overexposed PDM film which is clear only in the extreme highlight areas of the image.

2. Explanation of the Manner in Which the Complete Procedure is Described in the '835 Patent Plus Use of PDM In accordance with a preferred stepwise procedure, color photographic paper is placed over the vacuum board, using the registration pins to assure proper registration of paper and subsequent halftone films. It is desirable that color photographic paper be used which contains dyes causing the imagery produced therefrom to relatively closely match the colors which will be printed employing the yellow, magenta and cyan process inks employed in the lithographic printer.

The previously prepared yellow halftone separation negative is pinned to the vacuum board in overlying relationship to the color print paper with the emulsion side of the negative facing downwardly. An exposure is made through the yellow negative only with blue filter. After exposure through the negative and with the paper still in position, the yellow halftone separation positive is placed over the yellow negative with the emulsion surface thereof facing downwardly. A diffusion sheet approximately 0.007 thick (e.g., Cronaflex) is placed between negative and positive. The pins on the vacuum table are again used to ensure exact registration of the yellow positive with the yellow negative. The color print paper is exposed a second lime through blue filter for a time period as explained in the '835 patent.

The yellow halftone separation negative is removed from the vacuum board and replaced with the PDM with the registration pins being used to maintain the PDM in correct alignment with the yellow negative. With this combination a third exposure through the blue filter is carried out for a time period which is approximately 4 times that given each of the two the preceding exposures. The exact exposure time is selectively chosen dependent upon the density of the clear area in the pin dot maker (PDM) film.

The yellow halftone separation negative and PDM are removed from the vacuum board and the magenta halftone separation negative placed over the undeveloped print paper and exposed through the green filter followed by a second exposure made with magenta halftone separation positive, diffusion sheet and magenta separation negative in proper alignment with the print paper. This combination is exposed to light through a green filter for the time specified for the same step in the '835 patent.

The magenta halftone separation positive only is removed from the vacuum board and replaced with the PDM using the registration pins for proper alignment. The print paper is exposed for a third exposure through the green filter for approximately 4 times that given each of the two preceding exposures.

The magenta halftone separation negative and the PDM are removed from the vacuum board and the cyan halftone separation negative placed over the undeveloped print paper and exposed through the red filter followed by a second exposure made with the combination of the cyan halftone separation positive, diffusion sheet and the cyan halftone negative in proper alignment with the print paper. This sandwich is exposed to light through the red filter for the time specified for the same step in the '853 patent.

The cyan halftone separation positive only is removed from the vacuum board and replaced with the PDM using the registration pins for proper alignment. The print paper is exposed for a third exposure through the red filter for a time period approximately 4 times that given each of the two preceding exposures. The exact exposure time is again somewhat dependent on he density of clear area in the PDM film.

The cyan halftone separation negative and the PDM are removed from the vacuum table and the black halftone negative as described in the '835 patent is pinned to the vacuum table overlying the undeveloped print paper and correctly aligned with the exposed areas thereof from the preceding steps. Exposure is carried out with light passing through the black maker filter grid, composed of blue, green and red filters for exposure times as specified in the '835 patent disclosure.

It can be ascertained from the foregoing description that the undeveloped photographic print paper has now been subjected to a total of 10 successive exposures in the darkroom while remaining pinned to the vacuum table. The procedure may be simplified by use of a computer pre-programmed to control the operating parameters of each step as well as the sequence thereof.

The exposed photographic print paper is then developed, fixed, bleached, washed and dried as described in the '835 patent using conventional techniques and equipment to produce an enhanced color pre-press proof in three colors plus black.

The present method, when combined with the process of the '835 patent therefore provides the lithographer with complete versatility in altering the tonal value curve of the proof to accommodate a myriad of conditions. If the subject matter requires a tone value curve including mainly shadow detail, one exposure through RGB filters of cyan, magenta and yellow negatives only suffices. The result is commonly referred to as a position proof. If the subject matter mandates a tone value curve including mainly shadow and mid-tone value detail, exposures through each of the RGB filters is required with the yellow, magenta and cyan negatives respectively plus another exposure through the filters and appropriate separation positives with a diffusion sheet interposed therebetween. On the other hand, and as provided in this improved version of my basic invention, if the tone value curve to be reproduced includes significant shadow detail and highlight detail, the desired tone curve can be readily accomplished by carrying out two exposures through RGB filters with yellow, magenta and cyan negatives plus another exposure through a diffusion sheet and appropriate positives followed by a third exposure using a pin dot maker as described herein.

The present method of multiple exposures gains control of not only the shadow areas of each of the yellow, magenta and cyan, but also controls the three-quarter tone, mid-tone and quarter-tone, and further provides control of the highlight detail, vignettes, fin pin dots and other significant fine detail.

It is understood that the sequence described for exposure of the photographic print paper to the yellow, magenta and cyan halftone separation negatives and positives and the exposures of the negatives with the PDM, is not intended to denote that such sequence must be carried out in the order set forth. The same results are obtainable regardless of the order of the separation exposures.

I claim:

1. In a method of preparing an extended tonal range pre-press proof of an original subject in color using color print paper and wherein yellow, magenta and cyan color halftone separation negatives and positives of the original subject have been prepared, the improved steps of:

preparing a pin dot maker film positive (PDM) which is clear only in the fine highlight detail areas of the color original;

exposing the print paper to light through a blue filter with the yellow negative first and secondly with the yellow positive thereover;

again exposing the print paper to light through said blue filter with the yellow negative and the PDM thereover, the time of exposure being greater than the exposure time for the combination of the yellow negative and the yellow positive;

exposing the print paper to light through a green filter with the magenta negative first and secondly with the magenta positive thereover;

again exposing the print paper to light through said green filter with the magenta negative and the PDM thereover, the time of exposure being greater than the combination of the magenta negative and the magenta positive;

exposing the print paper to light through a red filter with the cyan negative first and secondly with the cyan positive thereover;

again exposing the print paper to light through said red filter with the cyan negative and the PDM thereover, the time of exposure being greater than the exposure time for the combination of the cyan negative and the cyan positive; and developing the print paper after all of the exposures have been completed to produce an extended tonal range pre-press proof having fine highlight detail areas representative of such areas in the color original.

2. A method of preparing an extended tonal range pre-press photographic color proof as set forth in claim 1, wherein is included the steps of providing a diffusion sheet between each pair of superimposed yellow, magenta and cyan positives and negatives during each of the second exposures of the print paper through the negative and positive combinations.

3. A method of preparing an extended tonal range pre-press photographic color proof as set forth in claim 1, wherein is included the step of again exposing the print paper with a skeletal black negative thereover to light through an RGB combination of filters.

4. A method of preparing an extended tonal range pre-press photographic color proof as set forth in claim 1, wherein is included the steps of exposing the undeveloped print paper to light through blue, green and red filters respectively with a full scale black halftone separation negative overlying the print paper, then carrying out a second exposure with a respective halftone positive overlying yellow, magenta, cyan and black negatives respectively through blue, green, red filters plus a filter grid RGB, and thirdly exposing the print paper through corresponding yellow, magenta, cyan and black full scale negatives, plus PDM respectively through RGB filters.

5. A method of preparing an extended tonal range pre-press photographic color proof as set forth in claim 1, wherein exposure of the print paper to light through said blue, green and red filters while a color halftone separation negative and the PDM is in overlying relationship to the undeveloped print paper for a time period that is approximately 4 times the exposure time of the exposure that takes place through a corresponding filter and a combination color halftone separation negative and positive sandwich.

6. A method of preparing an extended tonal range pre-press photographic color proof as set forth in claim 1, wherein the steps of preparing the PDM include exposing a lith type contact file to light through the yellow halftone separation negative and subsequently through the magenta halftone separation negative, and thereafter developing the contact film in a lith film processor to produce said PDM.

7. A method of preparing an extended tonal range pre-press photographic color proof as set forth in claim 1, including the steps of carrying out the procedure such that when light blue predominates in the highlight areas, the PDM exposures are made with the yellow halftone separation negative and subsequently through the cyan halftone separation negative.

8. A method of preparing an extended tonal range pre-press photographic color proof as set forth in claim 1, wherein said step of preparing the PDM includes exposing the contact film to light through said yellow and magenta halftone separation negative respectively in a manner maintaining correct registration of the magenta halftone separation negative with respect to the yellow halftone separation negative.

9. A method of preparing an extended tonal range pre-press photographic color proof as set forth in claim 1, wherein interchange of the halftone separation negative sand positives and the PDM is carried out in a manner maintaining correct registration thereof one with respect to another.

10. A method of preparing an extended tonal range pre-press photographic color proof as set forth in claim 9, wherein said registration of halftone separation negatives and positives and the PDM is maintained by successively pinning the negatives and positives and PDM to a support for the print paper.

* * * * *